(12) United States Patent
Shen et al.

(10) Patent No.: US 11,889,686 B2
(45) Date of Patent: Jan. 30, 2024

(54) VERTICAL MEMORY DEVICES

(71) Applicant: YANGTZE MEMORY TECHNOLOGIES CO., LTD., Wuhan (CN)

(72) Inventors: Miao Shen, Wuhan (CN); Li Hong Xiao, Wuhan (CN); Yushi Hu, Wuhan (CN); Qian Tao, Wuhan (CN); Mei Lan Guo, Wuhan (CN); Yong Zhang, Wuhan (CN); Jian Hua Sun, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/468,596

(22) Filed: Sep. 7, 2021

(65) Prior Publication Data

US 2021/0408026 A1 Dec. 30, 2021

Related U.S. Application Data

(60) Division of application No. 16/367,301, filed on Mar. 28, 2019, now abandoned, which is a continuation of
(Continued)

(51) Int. Cl.
*H10B 41/27* (2023.01)
*H10B 41/35* (2023.01)
(Continued)

(52) U.S. Cl.
CPC ............. *H10B 41/27* (2023.02); *H10B 41/35* (2023.02); *H10B 41/41* (2023.02); *H10B 43/27* (2023.02); *H10B 43/35* (2023.02); *H10B 43/40* (2023.02)

(58) Field of Classification Search
CPC ......... H01L 27/11556; H01L 27/11582; H10B 41/27; H10B 41/35; H10B 41/41
See application file for complete search history.

(56) References Cited

U.S. PATENT DOCUMENTS 9,406,692 B2 8/2016 Lee
9,754,963 B1 9/2017 Kawamura et al.
(Continued)

FOREIGN PATENT DOCUMENTS

CN 1702689 A 11/2005
CN 104064528 A 9/2014
(Continued)

OTHER PUBLICATIONS

International Search Report and Written Opinion dated Jul. 9, 2019, in PCT/CN2018/109752, 9 pages.
(Continued)

*Primary Examiner* — Matthew C Landau
*Assistant Examiner* — Mark Hatzilambrou
(74) *Attorney, Agent, or Firm* — Oblon, McClelland, Maier & Neustadt, L.L.P.

(57) ABSTRACT

Aspects of the disclosure provide a method for fabricating semiconductor device. The method includes characterizing an etch process that is used to etch channel holes and dummy channel holes in a stack of alternating sacrificial gate layers and insulating layers upon a substrate of a semiconductor device. The channel holes are in a core region and the dummy channel holes are in a staircase region. The stack of alternating sacrificial gate layers and insulating layers extend from the core region into in the staircase region of a stair-step form. The method further includes determining a first shape for defining the dummy channel holes in a layout
(Continued)

based on the characterization of the etch process. The first shape is different from a second shape for defining the channel holes.

16 Claims, 8 Drawing Sheets

Related U.S. Application Data application No. PCT/CN2018/109752, filed on Oct. 11, 2018.

(51) Int. Cl.
*H10B 41/41* (2023.01)
*H10B 43/27* (2023.01)
*H10B 43/35* (2023.01)
*H10B 43/40* (2023.01)

(56) References Cited

U.S. PATENT DOCUMENTS

| | | | |
|---|---|---|---|
| 9,881,929 B1 | 1/2018 | Ravikirthi et al. | |
| 10,020,315 B1* | 7/2018 | Kato | H01L 27/11519 |
| 10,109,644 B2 | 10/2018 | Shin et al. | |
| 2001/0045644 A1 | 11/2001 | Huang | |
| 2004/0082103 A1 | 4/2004 | Feng | |
| 2005/0133905 A1 | 6/2005 | Zhao et al. | |
| 2007/0170573 A1 | 7/2007 | Kuroda et al. | |
| 2011/0140068 A1* | 6/2011 | Ozawa | H01L 27/2418 257/4 |
| 2015/0194435 A1 | 7/2015 | Lee | |
| 2015/0262914 A1 | 9/2015 | Akou et al. | |
| 2015/0340376 A1 | 11/2015 | Park et al. | |
| 2016/0111441 A1 | 4/2016 | Park et al. | |
| 2016/0322381 A1 | 11/2016 | Liu et al. | |
| 2016/0329304 A1 | 11/2016 | Hatakeyama et al. | |
| 2016/0365352 A1 | 12/2016 | Nishikawa et al. | |
| 2017/0352680 A1 | 12/2017 | Shin et al. | |
| 2018/0068928 A1 | 3/2018 | Akou et al. | |
| 2018/0122819 A1 | 5/2018 | Shim et al. | |
| 2020/0027835 A1 | 1/2020 | Hsu et al. | |

FOREIGN PATENT DOCUMENTS

| | | |
|---|---|---|
| CN | 104766865 A | 7/2015 |
| CN | 106449648 A | 2/2017 |
| CN | 107464816 A | 12/2017 |
| CN | 108630669 A | 10/2018 |
| JP | 2011-60838 A | 3/2011 |
| KR | 10-2015-0081393 A | 7/2015 |
| KR | 10-2015-0133914 A | 12/2015 |
| TW | 200536095 A | 11/2005 |
| TW | 201349443 A | 12/2013 |
| TW | 201503295 A | 1/2015 |

OTHER PUBLICATIONS

Combined Chinese Office Action and Search Report dated Jul. 3, 2019, in Patent Application No. 2018800023349, 9 pages (with English Translation of Category of Cited Documents).
Chinese Office Action dated Aug. 12, 2019 in Chinese Patent Application No. 2018800019860, 8 pages.
Combined Chinese Office Action and Search Report dated Nov. 19, 2019 in Patent Application No. 2018800019860 (with English translation of Categories of Cited Documents), 14 pages.
Chinese Office Action dated Feb. 3, 2020, in Patent Application No. 2018800019860, 10 pages.
Extended European Search Report dated May 3, 2022 in European Patent Application No. 18936326.0, 11 pages.
Japanese Office Action dated Apr. 19, 2022 in Japanese Patent Application No. 2021-519663, 5 pages.
Korean Office Action dated Feb. 23, 2023 in the Korean Application No.: 10-2021-7007807, 7 pages.
European Office Action dated Sep. 15, 2023, in European Application No. 20 913 057.4, 6 pgs.

* cited by examiner

VERTICAL MEMORY DEVICES

RELATED APPLICATION

This application is a divisional application of U.S. patent application Ser. No. 16/367,301 "VERTICAL MEMORY DEVICES" filed Mar. 28, 2019, which is a continuation of International Application No. PCT/CN2018/109752, filed on Oct. 11, 2018. The entire disclosures of the prior applications are hereby incorporated by reference in their entirety.

BACKGROUND

Semiconductor manufactures developed vertical device technologies, such as three dimensional (3D) NAND flash memory technology, and the like to achieve higher data storage density without requiring smaller memory cells. In some examples, a 3D NAND memory device includes a core region and a staircase region. The core region includes a stack of alternating gate layers and insulating layers. The stack of alternating gate layers and insulating layers is used to form memory cells that are stacked vertically. The staircase region includes the respective gate layers in the stair-step form to facilitate forming contacts to the respective gate layers. The contacts are used to connect driving circuitry to the respective gate layers for controlling the stacked memory cells.

SUMMARY

Aspects of the disclosure provide a semiconductor device. The semiconductor device includes gate layers and insulating layers that are stacked alternatingly along a first direction perpendicular to a substrate of the semiconductor device in a first region upon the substrate. The gate layers and the insulating layers are stacked of a step form in a second region upon the substrate. The semiconductor device includes a channel structure that is disposed in the first region and extends in the first direction. The channel structure is through the gate layers and the insulating layers. The channel structure and the gate layers form a stack of transistors in a series configuration with the gate layers being gates for the transistors. The semiconductor device includes a contact structure disposed in the second region to form a conductive connection with one of the gate layers, and a first dummy channel structure disposed in the second region and around the contact structure. The first dummy channel structure is patterned with a first shape that is different from a second shape of the channel structure.

In some embodiments, the channel structure has a circular shape at a horizontal cross-section of the semiconductor device, and the first dummy channel structure has a non-circular shape at the horizontal cross-section. The first dummy channel structure has the non-circular shape that is adjustable by two or more parameters that define the non-circular shape. In an example, the first dummy channel structure has at least one of a capsule shape, a rectangular shape, and an arc shape.

According to an example, the semiconductor device includes a second dummy channel structure that is disposed to be symmetric to the first dummy channel structure with regard to the contact structure. In some example, the semiconductor device includes multiple dummy channel structures that are disposed around to the contact structure in a non-symmetric configuration with regard to the contact structure.

In some embodiments, the semiconductor device includes multiple dummy channel structures that are disposed around to the contact structure. The maximum distance between the multiple dummy channel structures is shorter than a first limit.

In some embodiments, the first dummy channel structure is formed of same materials as the channel structure. In some embodiments, the first dummy channel structure is formed of different materials from the channel structures.

In some embodiments, the semiconductor device includes a gate line slit structure that extends in the stack of the gate layers and the insulating layers. The maximum distance between the gate line slit structure and the first dummy channel structure is shorter than a second limit.

Aspects of the disclosure provide a method for fabricating semiconductor device. The method includes characterizing an etch process that is used to etch channel holes and dummy channel holes in a stack of alternating sacrificial gate layers and insulating layers upon a substrate of a semiconductor device. The channel holes are in a core region and the dummy channel holes are in a staircase region. The stack of alternating sacrificial gate layers and insulating layers extend from the core region into in the staircase region of a stair-step form. The method further includes determining a first shape for defining the dummy channel holes in a layout based on the characterization of the etch process. The first shape is different from a second shape for defining the channel holes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various fabrication technologies, such as gate-first fabrication technology, gate-last fabrication technology, and the like are developed to fabricate vertical memory devices. The gate-first fabrication technology forms gates of memory cells earlier than channels of the memory cells. The gate-last fabrication technology uses sacrificial gates to facilitate the formation of channels for memory cells; and replaces the sacrificial gates with real gates for the memory cells after the formation of the channels. The replacement of the sacrificial gates with the real gates includes a removal of the sacrificial gates, and then a formation of the real gates. When the sacrificial gates are removed, the channels of the memory cells can support core regions from collapse. Further, dummy channels can be formed in the staircase regions to support the staircase regions from collapse when the sacrificial gates are removed.

Aspects of the disclosure provide layout designs for the dummy channels in the staircase regions. The layout designs satisfy sustain distance requirements in order to support the staircase regions when the sacrificial gates are removed. Further, the present disclosure provides adjustment flexibility to the layout designs to alleviate influences of etch profile distortions for etching dummy channel holes for the dummy channels and/or contact holes for the contacts in the staircase regions.

In a related example, circles are used in the layout designs for the dummy channels, and are arranged in a symmetric pattern with regard to contacts in the staircase regions. The circles can be adjusted by radius.

In some embodiments of the present disclosure, non-circular shapes, such as a capsule shape, a rectangular shape, an arc shape, a bone shape, and the like are used for the dummy channels, and the non-circular shapes can be adjusted by two or more parameters, such as width, length, arc radius, arc angle, and the like. Further, in some embodiments, the non-circular shapes can be arranged in a symmetric pattern or in a non-symmetric pattern with regard to contacts in the staircase regions. According to the present disclosure, the layout designs for the dummy channels can be selected and adjusted according to etch profile characterization for etching dummy channel holes for forming the dummy channels (or etch profile characterization for etching contact holes for forming contacts) in the staircase regions, such that the negative influences of etch profile distortions for etching the dummy channel holes (or the etch profile distortion for etching the contact holes) in the staircase regions can be reduced.

Figure 1A:
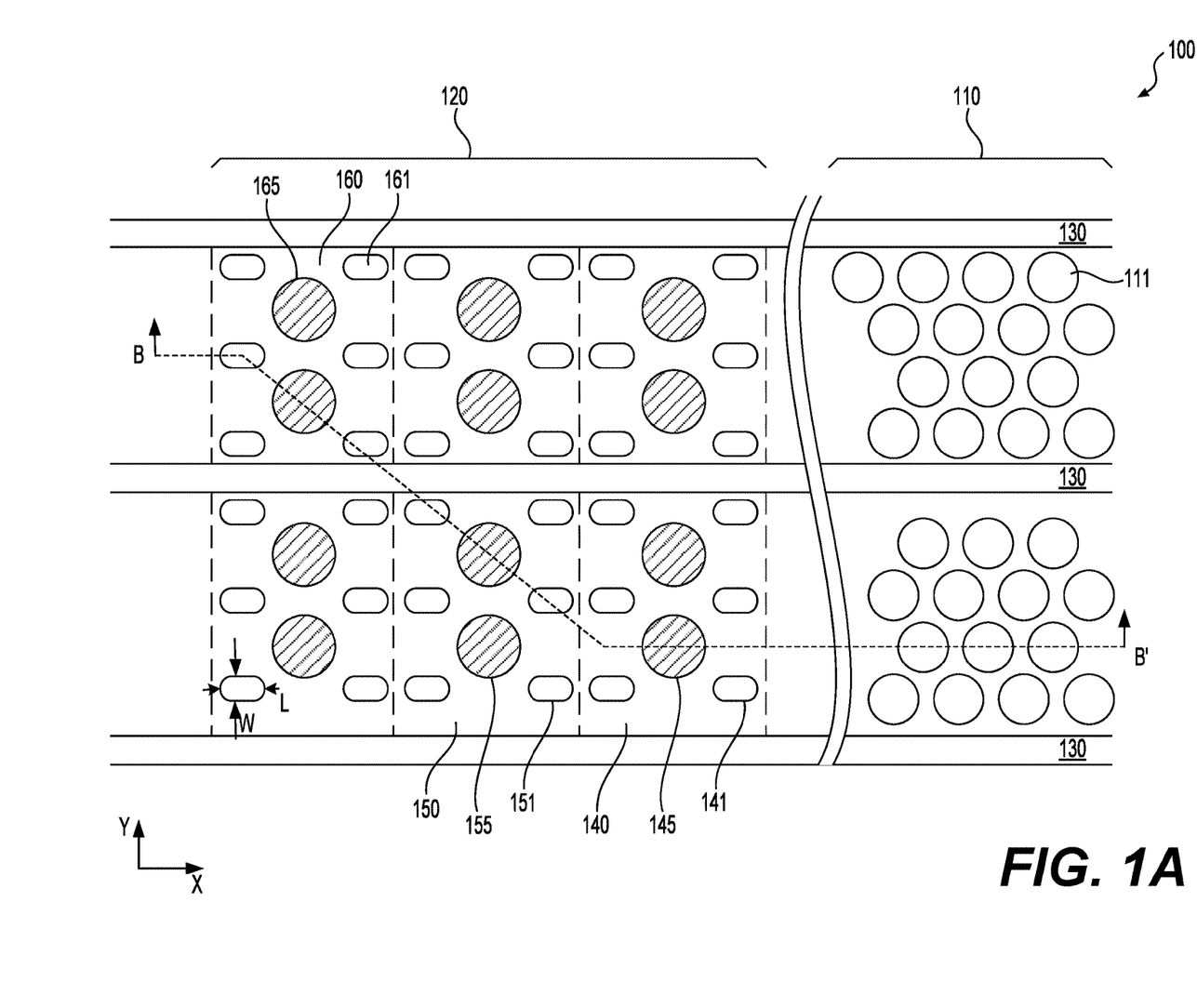
FIGS. 1A and 1B show a horizontal cross-sectional view and a vertical cross-sectional view of a semiconductor device in accordance with some embodiments.
Figure 1B:
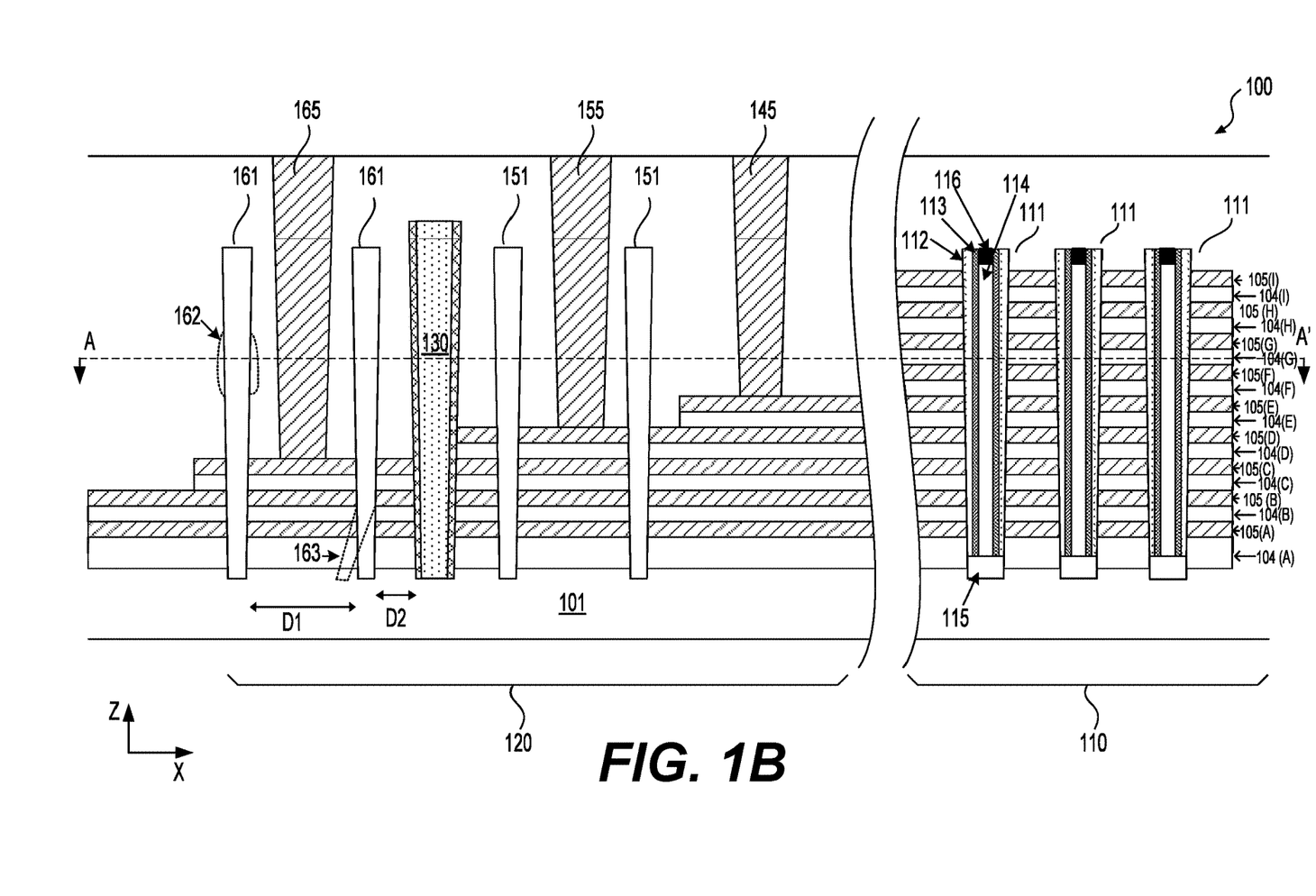

FIG. 1A shows a horizontal cross-sectional view and FIG. 1B shows a vertical cross-sectional view of a semiconductor device 100 in accordance with some embodiments of the disclosure. The semiconductor device 100 includes a substrate 101, and circuits formed on the thereupon. A main surface of the substrate 101 extends for example in the X direction and the Y direction. The horizontal cross-section (e.g., X-Y plane) is parallel to the main surface of the substrate 101, and the vertical cross-section (e.g., X-Z plane) is perpendicular to the main surface of the substrate 101. FIG. 1A shows a line B-B' for generating the vertical cross-sectional view in FIG. 1B; and FIG. 1B shows a line A-A' for generating the horizontal cross-sectional view in FIG. 1A.

The semiconductor device 100 refers to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like. The substrate 101 can be any suitable substrate, such as a silicon (Si) substrate, a germanium (Ge) substrate, a silicon-germanium (SiGe) substrate, and/or a silicon-on-insulator (SOI) substrate. The substrate 101 may include a semiconductor material, for example, a Group IV semiconductor, a Group III-V compound semiconductor, or a Group II-VI oxide semiconductor. The Group IV semiconductor may include Si, Ge, or SiGe. The substrate 101 may be a bulk wafer or an epitaxial layer.

In various embodiments, the semiconductor device 100 includes three dimensional (3D) NAND memory circuitry formed on the substrate 101. The semiconductor device 100 can include other suitable circuitry (not shown), such as logic circuitry, power circuitry, and the like that is formed on the substrate 101, or other suitable substrate, and is suitably coupled with the 3D NAND memory circuitry. Generally, the 3D NAND memory circuitry includes a memory array and peripheral circuitry (e.g., address decoder, driving circuits, sense amplifier and the like). The memory array is formed in a core region 110 as an array of vertical memory cell strings. The peripheral circuitry is formed in a peripheral region (not shown). Besides the core region 110 and the peripheral region, the semiconductor device 100 includes a staircase region 120 to facilitate making contacts to the gates of the memory cells in the vertical memory cell strings. The gates of the memory cells in the vertical memory cell strings correspond to word lines for the NAND memory architecture.

Specifically, in the FIG. 1A and FIG. 1B example, the core region 110 includes gate layers 105 (e.g., 105(A)-105(I)) and insulating layers 104 (e.g., 104(A)-104(I)) that are stacked alternatingly to form transistors that are stacked vertically. In some examples, the stack of transistors includes memory cells and select transistors, such as a ground select transistor, a string select transistor and the like. The gate layers 105 correspond to gates of the transistors. In an example, the gate layer 105(A) corresponds to a gate of a ground select transistor, the gate layer 105(I) corresponds to a gate of a string select transistor, and the other gate layers 105(B)-105(H) correspond to the gates of memory cells that are stacked vertically with the ground select transistor and the string select transistor. The gate layers 105(B)-105(H) also referred to as word lines in memory architecture. The gate layers 105 are made of a gate stack materials, such as high dielectric constant (high-k) gate insulator layers, metal gate (MG) electrode, and the like. The insulating layers 104 are made of insulating material(s), such as silicon nitride, silicon dioxide, and the like.

In the core region 110, a plurality of channel structures 111 are formed. In some embodiments, each channel structure 111 has a pillar shape that extends in the Z direction that is perpendicular to the direction of the main surface of the substrate 101. The plurality of channel structures 111 can be disposed separate from each other along the X direction and the Y direction, and can be disposed in some suitable array shape, such as a matrix array shape along the X direction and the Y direction, a zig-zag array shape along the X or Y direction, a beehive (e.g., hexagonal) array shape, and the like. In some embodiments, each of the channel structures 111 has a circular shape in the X-Y plane, and a pillar shape in the X-Z plane.

In some embodiments, each of the channel structure 111 is formed by materials in the circular shape in the X-Y plane, and extends in the Z direction. For example, each of the channel structures 111 includes a gate dielectric layer 112, a semiconductor layer 113, and an insulating layer 114 that have the circular shape in the X-Y plane, and extend in the Y direction. The gate dielectric layer 112 is formed on the sidewall of the channel structure 111, and includes multiple layers, such as a tunnel insulating layer (e.g., silicon oxide), a charge storage layer (e.g., silicon nitride), and a blocking insulating layer (e.g., silicon oxide) that are sequentially stacked from the sidewall. In an example, the gate dielectric layer 112 has an oxide-nitride-oxide (ONO) stack structure. The semiconductor layer 113 can be any suitable semiconductor material, such as polysilicon or monocrystalline silicon, and the semiconductor material may be un-doped or may include a p-type or n-type dopant. The insulating layer 114 is formed of an insulating material, such as silicon oxide and/or silicon nitride, and/or may be formed as an air gap.

The channel structures 111 include other suitable components. For example, each channel structure 111 includes a first end structure 115 and a second end structure 116. In some embodiments, the first end structures 115 and the second end structures 116 are formed of any suitable semiconductor material, such as polysilicon or monocrystalline silicon, and the semiconductor material may be un-doped or may include a p-type or n-type dopant. In an example, the first end structure 115 is the source of the ground select transistor, and the second end structure 116 is the drain of the string select transistor.

Further, in the FIG. 1A and FIG. 1B example, the stack of the gate layers 105 and insulating layers 104 extend into the staircase region 120, and forms stair-steps (e.g., stair-steps 140, 150, 160) to facilitate forming contacts (e.g., contacts 145, 155 and 165) to the gate layers 105. The contacts are used to connect driving circuitry, such as word line driving circuitry, ground select driving circuitry, string select driving circuitry, and the like in the periphery circuitry to the respective gates of the transistors in the stack.

In some examples, the top portions of the stack are selectively removed at different stair-steps. For example, at the stair-step 140, the top portion of the stack that is above the gate layer 105(E) is removed; at the stair-step 150, the top portion of the stack that is above the gate layer 105(D) is removed; at the stair-step 160, the top portion of the stack that is above the gate layer 105(C) is removed. Thus, contact holes for the contacts 145, 155 and 165 are formed by a single etch process. The etch process is configured to stop at, for example, the top gate layer. Thus, the contact holes for the stair-step 140 stops at the gate layer 105(E); the contact holes for the stair-step 150 stops at the gate layer 105(D); the contact holes for the stair-step 160 stops at the gate layer 105(C). When the contact holes are filled with metal to form the contacts 145, 155 and 165, the contacts 145 are conductively connected with the gate layer 105(E); the contacts 155 are conductively connected with the gate layer 105(D); and the contacts 165 are conductively connected with the gate layer 105(C).

According to the disclosure, a gate-last process is used to form the semiconductor device 100, and dummy channel structures (e.g., dummy channel structures 141, 151, 161 . . . ) are formed in the staircase region 120 to support the staircase region 120. During the gate-last process, initially, sacrificial gate layers (not shown in FIG. 1B and will be shown in FIGS. 6 and 7) are used in the place of the gate layers 105, thus the initial stack includes the sacrificial gate layers and the insulating layers 104 that are alternatingly deposited on the substrate 101 in the core region 110 and the staircase region 120. Further, the stair-steps are formed in the staircase region 120, for example by selectively removing the top portions of the stack at different stair-steps. In an example, the stair-steps are formed by trim-and-etch procedures. Then, the channel structures 111 are formed in the core region 110 and the dummy channel structures 141, 151 and 161 are formed in the staircase region 120.

Further, the sacrificial gate layers are replaced by the gate layers 105. In the core region 110, gates to the transistors are formed. In an example, gate line slits (GLS) 130 are etched as trenches in the stack. Etchants to the sacrificial gate layers are applied via the GLS 130 to remove the sacrificial gate layers. In an example, the sacrificial gate layers are made of silicon nitride, and the hot sulfuric acid ($H_2SO_4$) is applied via the GLS 130 to remove the sacrificial gate layers. Further, via the GLS 130, the gates to the transistors in the core regions are formed. In an example, the gates are formed of a high-k dielectric layer, a glue layer and a metal layer. The high-k dielectric layer can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

It is noted that, when the sacrificial gate layers are removed, the channel structures 111 support the stack of the insulating layers 104 in the core region 110, and the dummy channel structures 141, 151, 161 and the like support the stack of insulating layers 104 in the staircase region 120. According to an aspect of the disclosure, to provide the support, the channel structures and the dummy channel structures need to satisfy max sustain distance requirement. In an example, the max sustain distance requirement requires the maximum distance (D1) between two dummy channel structures to be smaller than a first limit, and the maximum distance (D2) between a dummy channel structure to a GLS to be smaller than a second limit. In an example, the first limit and the second limit are predetermined to ensure sufficient support without collapse.

In some embodiments, the dummy channel structures 141, 151, 161 and the like are formed with the channel structures 111, and thus the dummy channel structures 141, 151, 161 are formed of the same material as the channel structures 111. In some embodiments, the dummy channel structures 141, 151, 161 and the like are formed of different materials from the channel structures 111, for example using a mask layer to differentiate the core region 110 and the staircase region 120.

According to some aspects of the disclosure, the dummy channel structures 141, 151 and 161 are patterned to have shapes that are differently from the channel structures 111. In the FIG. 1A example, the channel structures 111 have a circular shape at the horizontal cross-section, and the dummy channel structures 141, 151 and 161 have a capsule shape at the horizontal cross-section. The size of the circular shape can be adjusted by a radius, and the capsule shape can be adjusted by a width (W) and a length (L). It is noted that any suitable non-circular shapes can be used for the dummy channel structures 141, 151, 161 and the like. Some examples are shown in FIGS. 2A-2F, and FIGS. 3A-3D.

In the FIG. 1A example, the dummy channel structures 141, 151 and 161 are arranged to have a symmetric pattern with regard to the contacts 145, 155 and 165. It is noted that the dummy channel structures 141, 151, 161 and the like can be arranged to have a symmetric pattern or a non-symmetric pattern with regard to the contacts 145, 155 and 165. Some symmetric pattern examples are shown in FIGS. 2A-2F, and some non-symmetric pattern examples are shown in FIGS. 3A-3D.

In some embodiments, the dummy channel structures 141, 151 and 161 are designed not to overlap with the contact structurers 145, 155 and 165. In addition, the dummy channel structures need to satisfy max sustain distance requirement. When circular shape is used for the dummy channel structures, designers have more limitation to arrange the dummy channel structures. When non-circular shapes are used, the designers have more adjustable parameters for layout adjustment.

In some embodiments, to improve the data storage density, there are relatively large number of layers in the stack of gate layers 105 and insulating layers 104, and thus the stack is relatively thick. To reduce fabrication cost, in an example, the channel holes for the channel structures and the dummy channel structures are formed by a one-step etch process. In an example, the etch process may cause etch profile distortions, such as bowing distortion as shown by 162, twisting distortion as shown by 163, and the like. The etch profile distortions can cause defects, such as circuit shorts and the like and reduce production yield. When a non-circular shape is used, the designers have more adjustment flexibility in the X direction and/or Y direction to alleviate the etch profile distortions, and thus using the non-circular shape can reduce the negative influence of the etch profile distortion and improve production yield.

FIGS. 2A-2F show layout design examples of symmetric patterns in accordance with some embodiments.

Figure 2A:
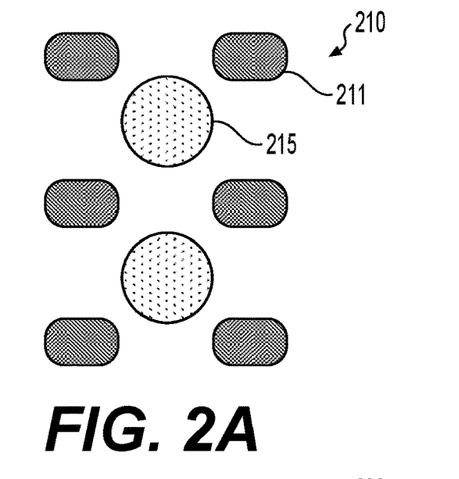
FIGS. 2A-2F show layout design examples of symmetric patterns in accordance with some embodiments.

FIG. 2A shows a layout design 210 of dummy channel structures and contact. The layout design 210 is used for fabricating the semiconductor device 100. The layout design 210 includes, in a contact layer of the layout design 210, circular shapes 215 for contacts, such as the contacts 155, and includes, in a channel layer of the layout design 210, capsule shapes 211 for the dummy channel structures, such as the dummy channel structures 151. When the layout design 210 is used to fabricate semiconductor device 100, the dummy channel structures 151 are defined according to the capsule shapes 211, thus the dummy channel structures 151 have the capsule shape at the horizontal cross-section.

Figure 2B:
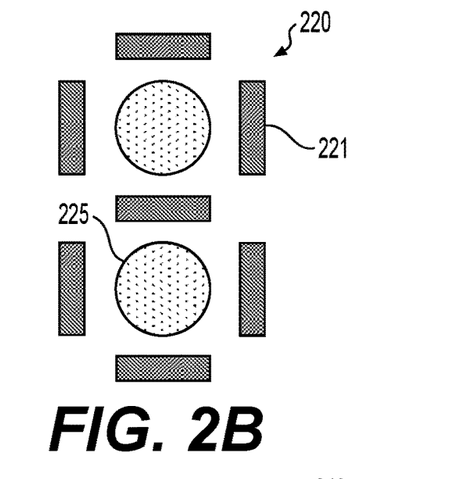

FIG. 2B shows a layout design 220 of dummy channel structures and contacts. The layout design 220 can be used to replace the layout design 210 to fabricate semiconductor devices. The layout design 220 includes, in a contact layer of the layout design 220, circular shapes 225 for contacts, and includes, in a channel layer of the layout design 220, rectangular shapes 221 for dummy channel structures. The rectangular shapes 221 are arranged around the circular shapes 225 on four sides in a symmetric pattern with regard to the circular shapes 225. When the layout design 220 is used to fabricate a semiconductor device, dummy channel structures of the semiconductor device are then defined according to the rectangular shapes 221.

Figure 2C:
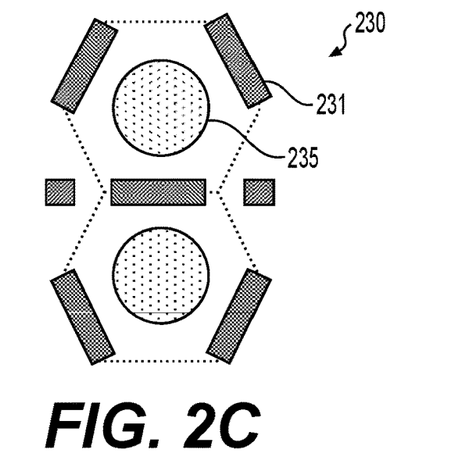

FIG. 2C shows a layout design 230 of dummy channel structures and contacts. The layout design 230 can be used to replace the layout design 210 to fabricate semiconductor devices. The layout design 230 includes, in a contact layer of the layout design 230, circular shapes 235 for contacts, and includes, in a channel layer of the layout design 230, rectangular shapes 231 for dummy channel structures. The rectangular shapes 231 are arranged around the circular shapes 235 on three sides of a hexagonal pattern in a symmetric pattern with regard to the circular shapes 235. When the layout design 230 is used to fabricate a semiconductor device, dummy channel structures of the semiconductor device are then defined according to the rectangular shapes 231.

Figure 2D:
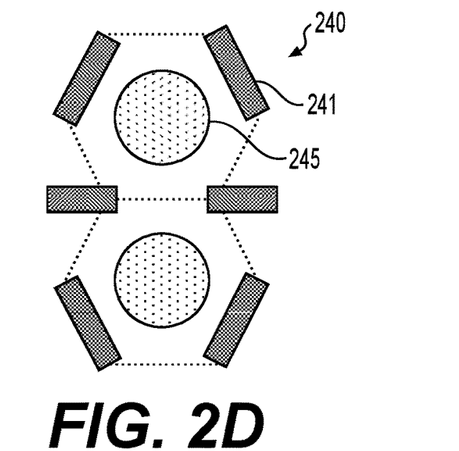

FIG. 2D shows a layout design 240 of dummy channel structures and contacts. The layout design 240 can be used to replace the layout design 210 to fabricate semiconductor devices. The layout design 240 includes, in a contact layer of the layout design 240, circular shapes 245 for contacts, and includes, in a channel layer of the layout design 240, rectangular shapes 241 for dummy channel structures. The rectangular shapes 241 are arranged around the circular shapes 245 in a symmetric pattern with regard to the circular shapes 245. When the layout design 240 is used to fabricate a semiconductor device, dummy channel structures of the semiconductor device are then defined according to the rectangular shapes 241.

Figure 2E:
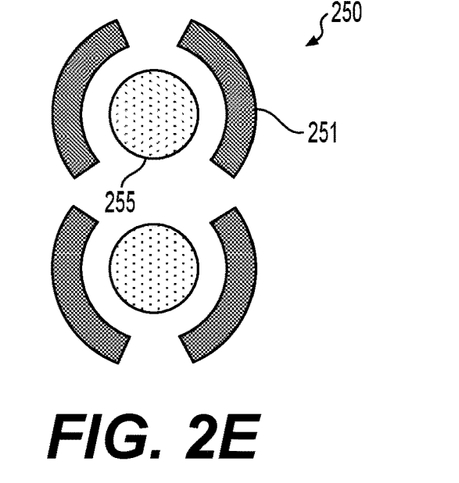

FIG. 2E shows a layout design 250 of dummy channel structures and contacts. The layout design 250 can be used to replace the layout design 210 to fabricate semiconductor devices. The layout design 250 includes, in a contact layer of the layout design 250, circular shapes 255 for contacts, and includes, in a channel layer of the layout design 250, arc shapes 251 for dummy channel structures. The arc shapes 251 are arranged around the circular shapes 255 in a symmetric pattern with regard to the circular shapes 255. When the layout design 250 is used to fabricate a semiconductor device, dummy channel structures of the semiconductor device are then defined according to the arc shapes 251.

Figure 2F:
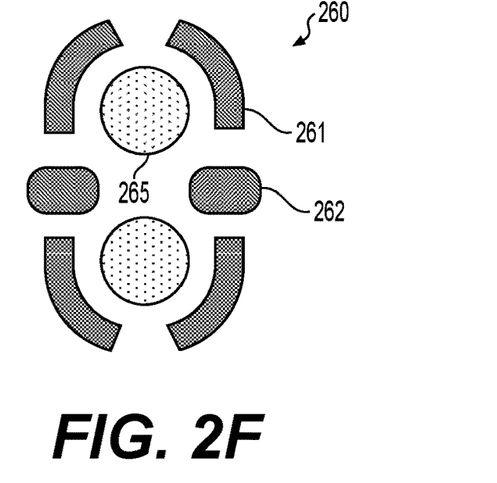

FIG. 2F shows a layout design 260 of dummy channel structures and contacts. The layout design 260 can be used to replace the layout design 210 to fabricate semiconductor devices. The layout design 260 includes, in a contact layer of the layout design 260, circular shapes 265 for contacts, and includes, in a channel layer of the layout design 260, arc shapes 261 and capsule shapes 262 for dummy channel structures. The arc shapes 261 and the capsule shapes 262 are arranged around the circular shapes 265 in a symmetric pattern with regard to the circular shapes 265. When the layout design 260 is used to fabricate a semiconductor device, dummy channel structures of the semiconductor device are then defined according to the arc shapes 261 and the capsule shapes 262.

FIGS. 3A-3D show layout design examples of non-symmetric patterns in accordance with some embodiments.

Figure 3A:
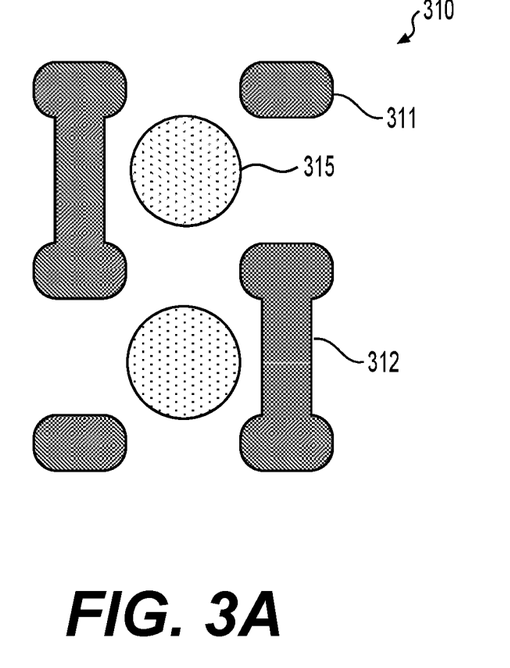
FIGS. 3A-3D show layout design examples of non-symmetric patterns in accordance with some embodiments.

FIG. 3A shows a layout design 310 of dummy channel structures and contacts. The layout design 310 can be used to replace the layout design 210 to fabricate semiconductor devices. The layout design 310 includes, in a contact layer of the layout design 310, circular shapes 315 for contacts, and includes, in a channel layer of the layout design 310, capsule shapes 311 and bone shapes 312 for dummy channel structures. The capsule shapes 311 and the bone shapes 312 for dummy channel structures are arranged around the circular shapes 315 in a non-symmetric pattern with regard to the circular shapes 315. When the layout design 310 is used to fabricate a semiconductor device, dummy channel structures of the semiconductor device are then defined according to the capsule shapes 311 and the bone shapes 312.

Figure 3B:
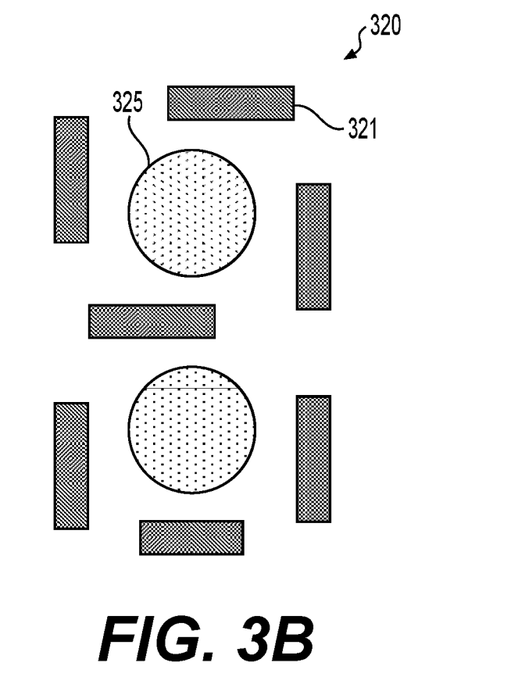

FIG. 3B shows a layout design 320 of dummy channel structures and contacts. The layout design 320 can be used to replace the layout design 210 to fabricate semiconductor devices. The layout design 320 includes, in a contact layer of the layout design 320, circular shapes 325 for contacts, and includes, in a channel layer of the layout design 320, rectangular shapes 321 for dummy channel structures. The rectangular shapes 321 for dummy channel structures are arranged around the circular shapes 325 in a non-symmetric pattern with regard to the circular shapes 325. When the layout design 320 is used to fabricate a semiconductor device, dummy channel structures of the semiconductor device are then defined according to the rectangular shapes 321.

Figure 3C:
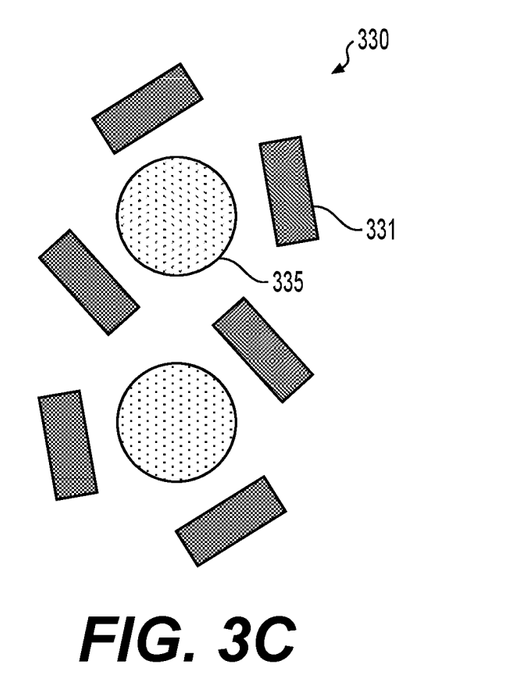

FIG. 3C shows a layout design 330 of dummy channel structures and contacts. The layout design 330 can be used to replace the layout design 210 to fabricate semiconductor devices. The layout design 330 includes, in a contact layer of the layout design 330, circular shapes 335 for contacts, and includes, in a channel layer of the layout design 320, rectangular shapes 331 for dummy channel structures. The rectangular shapes 331 for dummy channel structures are arranged around the circular shapes 335 in a non-symmetric pattern with regard to the circular shapes 335. When the layout design 330 is used to fabricate a semiconductor device, dummy channel structures of the semiconductor device are then defined according to the rectangular shapes 331.

Figure 3D:
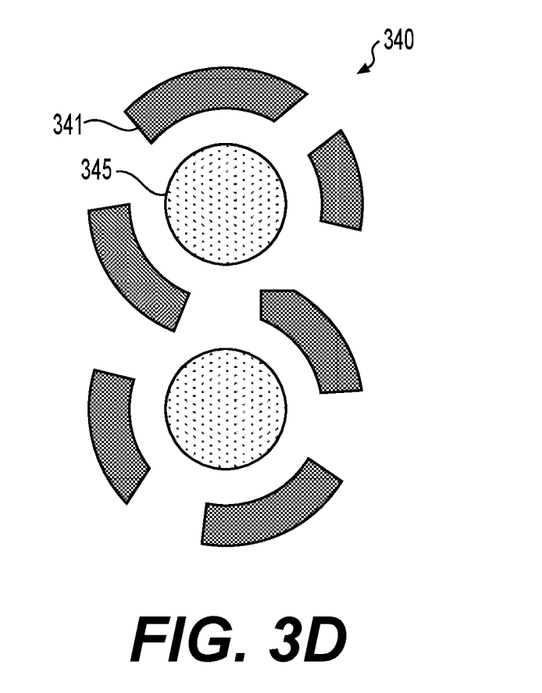

FIG. 3D shows a layout design 340 of dummy channel structures and contacts. The layout design 340 can be used to replace the layout design 210 to fabricate semiconductor devices. The layout design 340 includes, in a contact layer of the layout design 340, circular shapes 345 for contacts, and includes, in a channel layer of the layout design 340, arc shapes 341 for dummy channel structures. The arc shapes 341 for dummy channel structures are arranged around the circular shapes 345 in a non-symmetric pattern with regard to the circular shapes 345. When the layout design 340 is used to fabricate a semiconductor device, dummy channel structures of the semiconductor device are then defined according to the arc shapes 341.

Figure 4:
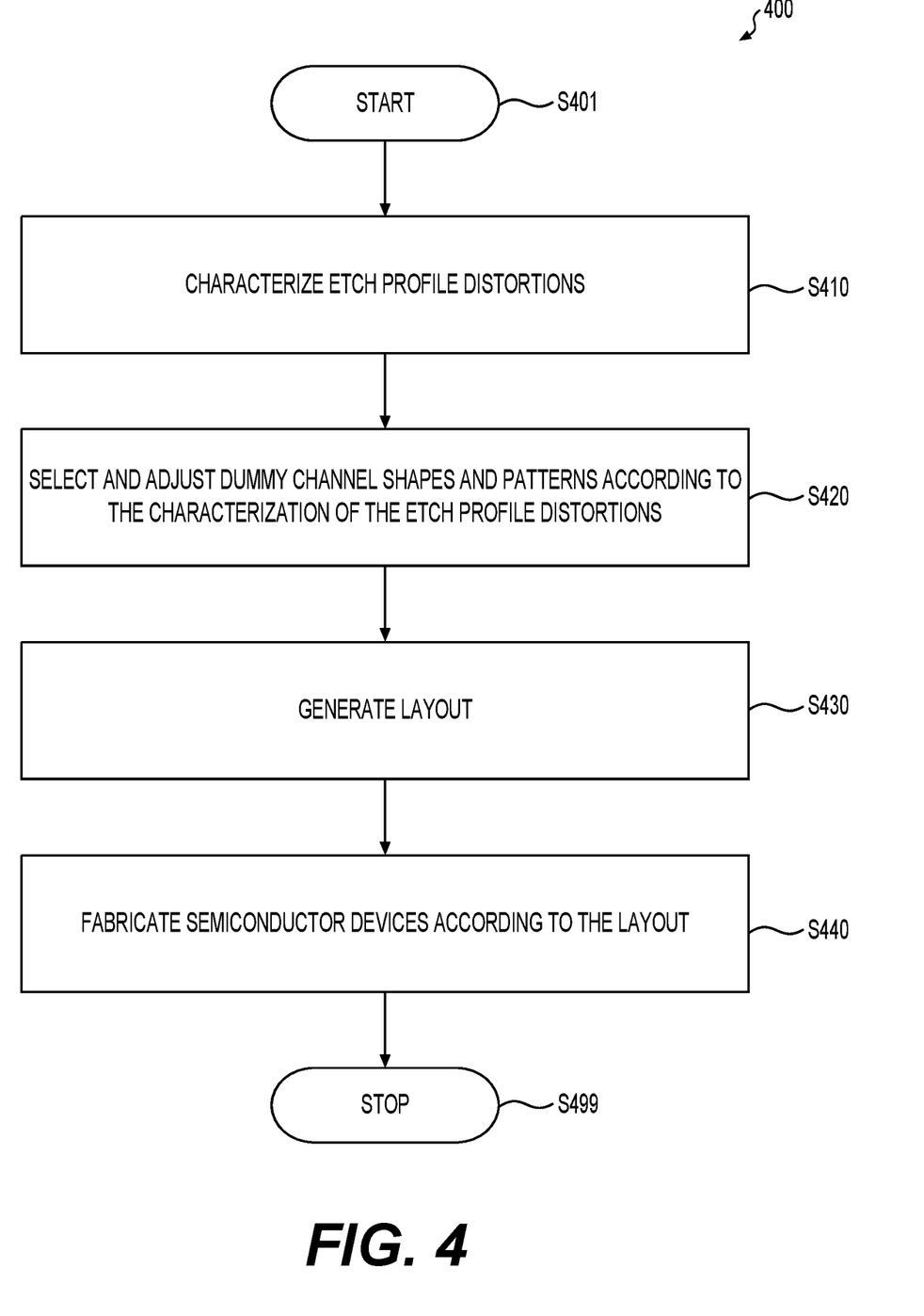
FIG. 4 shows a flow chart outlining a process example according to an embodiment of the disclosure.

FIG. 4 shows a flow chart outlining a process example 400 according to an embodiment of the disclosure. The process 400 is used to generate a layout design for 3D NAND memory device, and then fabricate semiconductor devices according to the layout design. The process starts at S401, and proceeds to S410.

At S410, etch profile distortions are characterized for an etch process. The etch process generates channel holes for channel structures in a core region and generates dummy channel holes for dummy channel structures in a staircase region of a semiconductor device.

At S420, shapes and patterns for the dummy channel structures are selected and adjusted according to the characterization of the etch profile distortions. In some examples, various non-circular shapes, such as capsule shapes, rectangular shapes, arc shapes, bone shapes, and the like can be selected. The shapes can be adjusted by two or more parameters in the X direction and/or Y directions. The non-circular shapes can be arranged around contact shapes in a symmetric pattern, or a non-symmetric pattern.

At S430, a layout is generated. The layout has many layers, such as a channel layer for defining channel structures in the core regions and dummy channel structures in the staircase regions, a contact layer for defining contacts in a staircase region, and the like. The channel layer includes the selected and adjusted shapes and patterns for the dummy channel structures in an area of the layout corresponding to the staircase region.

At S440, the layout is used to fabricate semiconductor devices, such as the semiconductor device 100. In an example, a set of masks is generated according to the layout. Then, the set of masks is used in a gate-last process to fabricate for example the semiconductor device 100. Then the process proceeds to S499 and terminates.

Figure 5:
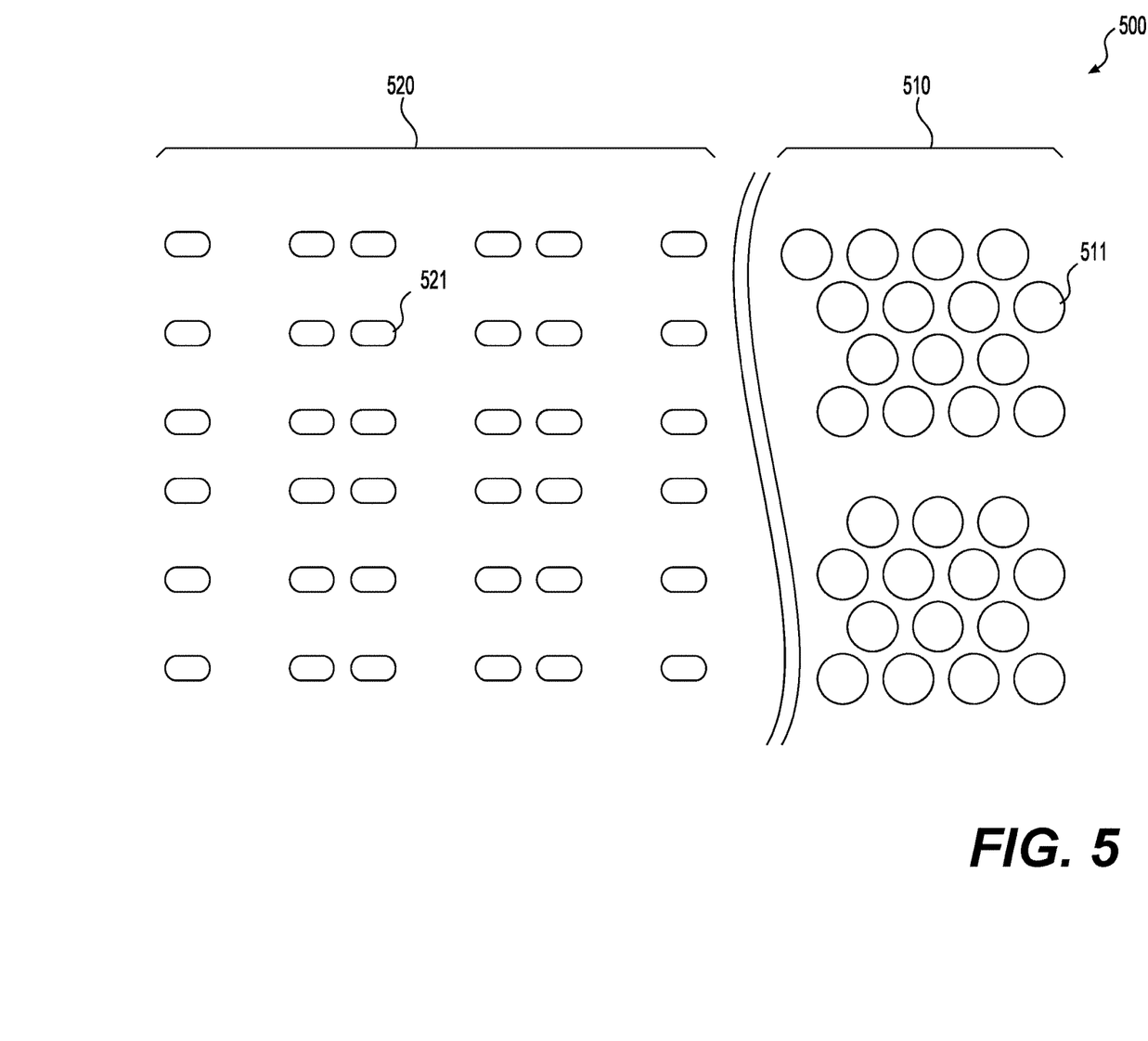
FIG. 5 shows a mask according to some embodiments of the disclosure.

FIG. 5 shows a mask 500 according to some embodiments of the disclosure. The mask 500 is generated according a channel layer in a layout. The mask 500 includes a core area 510 corresponding to the core region 110 and a staircase area 520 corresponding to the staircase region 120. The core area 510 includes a plurality of circular shapes 511 that define the shapes of channel holes and channel structures. The staircase area 520 includes capsule shapes 521 that define the shapes of dummy channel holes and dummy channel structures. The mask 500 is used to create channel holes in the core region 110 and the dummy channel holes in the staircase region 120.

Figure 6:
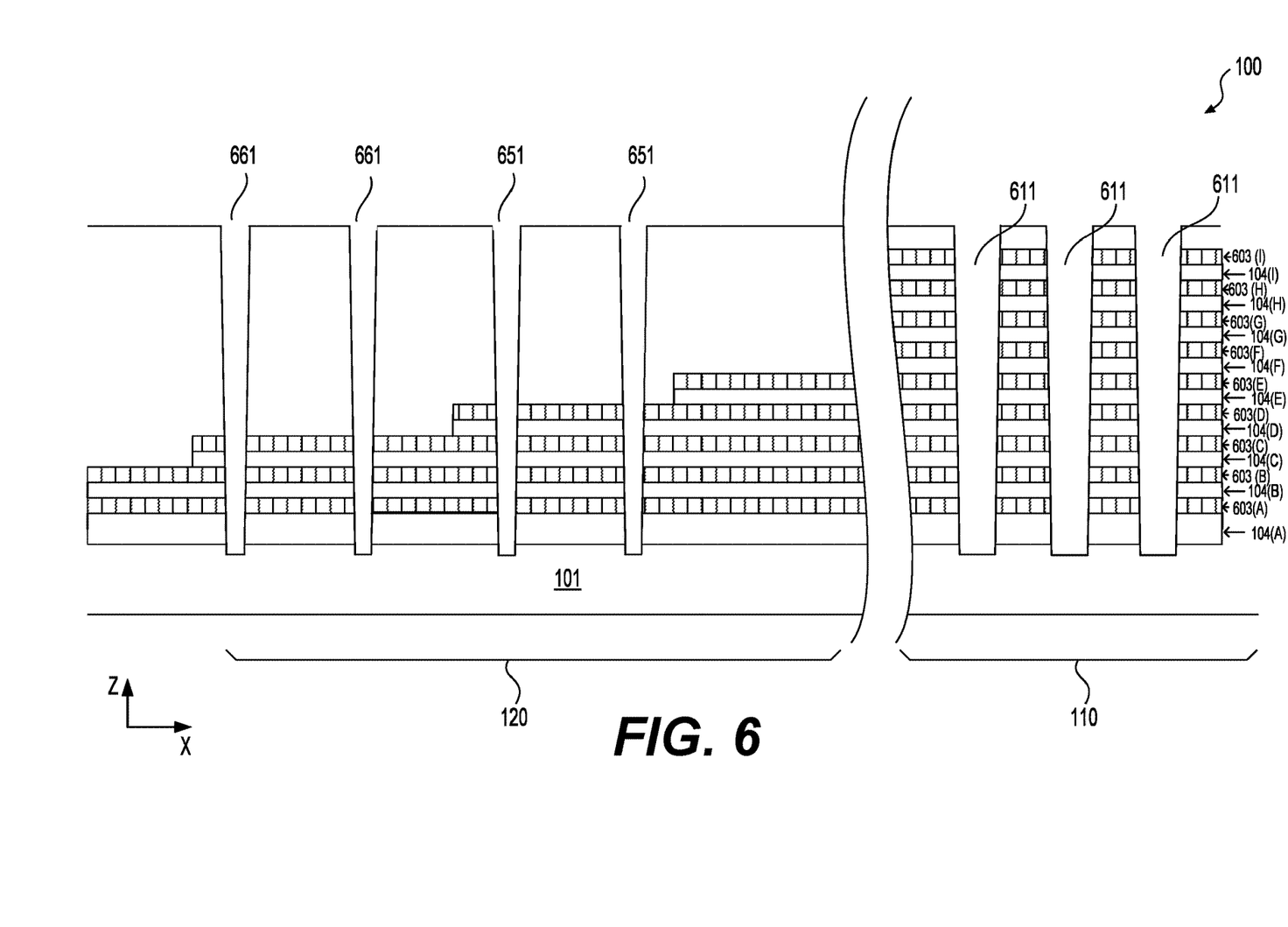
FIGS. 6 and 7 show horizontal cross-sectional views of the semiconductor device during a fabrication process in accordance with some embodiments

FIG. 6 shows a horizontal cross-sectional view of the semiconductor device 100 during a gate-last process after a channel etch process according to some embodiments of the disclosure. The channel etch process generates channel holes and dummy channel holes according to the mask 500 in an example. The horizontal cross-sectional view is generated according to the line A-A' in FIG. 1B.

During the gate-last process, initially, sacrificial gate layers 603 (e.g., 603(A)-603(I)) are used in the place of the gate layers 105, thus the initial stack includes the sacrificial gate layers 603 and the insulating layers 104 that are alternatively deposited on the substrate 101 in the core region 110 and the staircase region 120. Further, the stair-steps are formed in the staircase region 120, for example by selectively removing the top portions of the stack at different stair-steps. In an example, suitably planarization process is performed to obtain a relatively flat surface.

Then, photo lithography technology is used to define patterns in photoresist and/or hard mark layers according to the mask 500, and etch technology is used to transfer the patterns into the stack of sacrificial gate layers 603 and insulating layers 105. Thus, channel holes 611 are formed in the core region 110 and the dummy channel holes 651 and 661 are formed in the staircase region 120.

Then, channel structures are formed in the channel holes, and dummy channel structures are formed in the dummy channel holes. In some embodiments, dummy channel structures can be formed with the channel structures, thus the dummy channel structures are formed of the same materials as the channel structures. In some embodiments, the dummy channel structures are formed differently from the channel structures.

Figure 7:
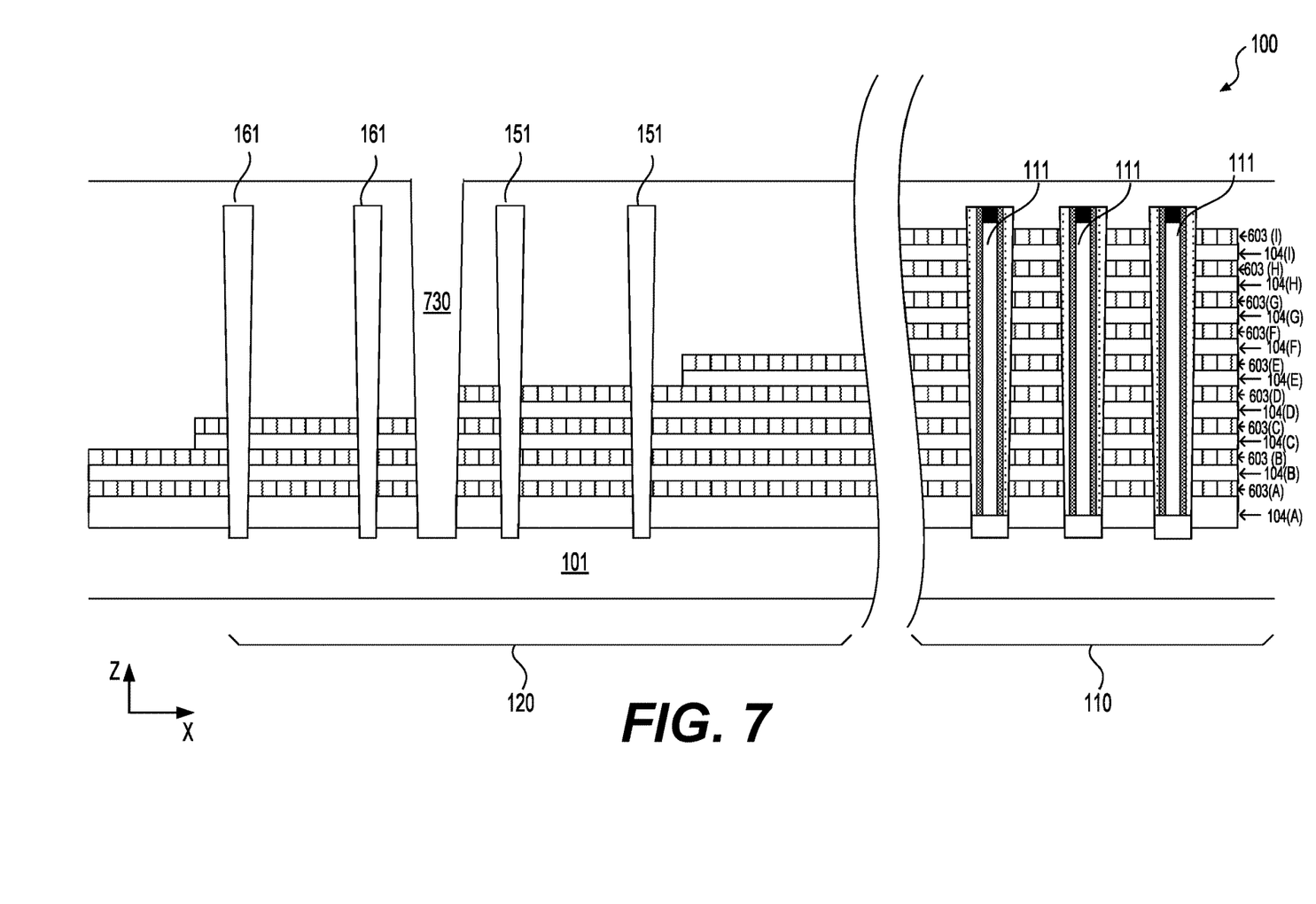

FIG. 7 shows a horizontal cross-sectional view of the semiconductor device 100 during the gate-last process after a GLS etch process according to some embodiments of the disclosure. The horizontal cross-sectional view is generated according to the line A-A' in FIG. 1B.

In the FIG. 7 example, the channel structures 111 and the dummy channel structures 151 and 161 are formed. The channel structures 111 are formed in the core region 110 and the dummy channel structures 151 and 161 are formed in the staircase region 120. In some embodiments, dummy channel structures 151 and 161 can be formed with the channel structures 111 of the same materials. In some embodiments, dummy channel structures 151 and 161 can be formed of different materials from the channel structures 111.

In the FIG. 7 example, GLS 730 are etched as trenches in the stack. Using the GLS 730, the sacrificial gate layers 603 can be replaced by the gate layers 105. In an example, etchants to the sacrificial gate layers are applied via the GLS 730 to remove the sacrificially layers. In an example, the sacrificial gate layers are made of silicon nitride, and the hot sulfuric acid ($H_2SO_4$) is applied via the GLS 730 to remove the sacrificial gate layers. Further, via the GLS 730, gate stacks to the transistors in the core regions are formed. In an example, a gate stack is formed of a high-k dielectric layer, a glue layer and a metal layer. The high-k dielectric layer can include any suitable material that provide the relatively large dielectric constant, such as hafnium oxide ($HfO_2$), hafnium silicon oxide ($HfSiO_4$), hafnium silicon oxynitride (Hf-SiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

The gate-last process continues to, for example, fill the gate line slit 730 with spacer material (e.g., silicon oxide) and common source material (e.g., tungsten) to form the GLS 130, form the contacts 145, 155 and 165, and the like, form metal traces and the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating semiconductor device, comprising:
characterizing an etch process that is used to etch channel holes and dummy channel holes in a stack of alternating sacrificial gate layers and insulating layers upon a substrate of a semiconductor device, the channel holes being in a core region and the dummy channel holes being in a staircase region, the stack of alternating sacrificial gate layers and insulating layers extending from the core region into in the staircase region of a stair-step form; and
determining a first shape for defining the dummy channel holes in a layout based on the characterization of the etch process, the first shape being different from a second shape for defining the channel holes;
wherein the determining the first shape includes:
determining a capsule shape and a bone shape for the dummy channel holes that are different from a circle shape of the channel holes,
determining a capsule shape and an arc shape for the dummy channel holes that are different from a circle shape of the channel holes,
determining a bone shape for the dummy channel holes that is different from a circle shape of the channel holes,
determining an arc shape for the dummy channel holes that is different from a circle shape of the channel holes, or
determining a rectangle shape for the dummy channel holes that is different from a circle shape of the channel holes, wherein three of the dummy channel holes are arranged around a contact structure on three sides of a hexagonal pattern with regard to the contact structure, the three sides separated from one another.

2. The method of claim 1, further comprising:
generating the layout for the semiconductor device, the layout having first instances of the first shape in a first area of the layout corresponding to the staircase region, and having second instances of the second shape in a second area of the layout corresponding to the core region.

3. The method of claim 2, further comprising:
generating a mask layer in the layout to differentiate the core region and the staircase region, the mask layer being used to form first dummy channel structures corresponding to the dummy channel holes in the staircase region with different materials from channel structures corresponding to the channel holes in the core region.

4. The method of claim 1, comprising:
the determining the capsule shape and the bone shape for the dummy channel holes that are different from the circle shape of the channel holes.

5. The method of claim 1, comprising:
the determining the capsule shape and the arc shape for the dummy channel holes that are different from the circle shape of the channel holes.

6. The method of claim 1, comprising:
the determining the bone shape for the dummy channel holes that is different from the circle shape of the channel holes.

7. The method of claim 1, comprising:
the determining the arc shape for the dummy channel holes that is different from the circle shape of the channel holes.

8. The method of claim 7, wherein at least two of the dummy channel holes have different lengths.

9. The method of claim 1, comprising:
determining a rectangle shape for the dummy channel holes that is different from a circle shape of the channel holes, wherein the three of the dummy channel holes are arranged around the contact structure on the three sides of the hexagonal pattern with regard to the contact structure, the three sides separated from one another.

10. A semiconductor device, comprising:
gate layers and insulating layers that are stacked alternatingly along a first direction perpendicular to a substrate of the semiconductor device in a first region upon the substrate, wherein the gate layers and the insulating layers are stacked of a stair-step form in a second region upon the substrate;

channel holes that are disposed in the first region and extend in the first direction, wherein the channel holes are through the gate layers and the insulating layers, and the channel holes and the gate layers form a stack of transistors in a series configuration;

a contact structure disposed in the second region to form a conductive connection with one of the gate layers; and multiple dummy channel holes that are disposed around the contact structure in a non-symmetric configuration with regard to the contact structure, wherein the dummy channel holes are patterned with a capsule shape and a bone shape that are different from a circle shape of the channel holes, the dummy channel holes are patterned with a capsule shape and an arc shape that are different from a circle shape of the channel holes, the dummy channel holes are patterned with a bone shape that is different from a circle shape of the channel holes, the dummy channel holes are patterned with an arc shape that is different from a circle shape of the channel holes, or the dummy channel holes are patterned with a rectangle shape that is different from a circle shape of the channel holes, and three of the dummy channel holes are arranged around a contact structure on three sides in a hexagonal pattern with regard to the contact structure, the three sides separated from one another.

11. The semiconductor device of claim 10, wherein the dummy channel holes are patterned with the capsule shape and the bone shape that are different from the circle shape of the channel holes.

12. The semiconductor device of claim 10, wherein the dummy channel holes are patterned with the capsule shape and the arc shape that are different from the circle shape of the channel holes.

13. The semiconductor device of claim 10, wherein the dummy channel holes are patterned with the bone shape that is different from the circle shape of the channel holes.

14. The semiconductor device of claim 10, wherein the dummy channel holes are patterned with the arc shape that is different from the circle shape of the channel holes.

15. The semiconductor device of claim 14, wherein at least two of the dummy channel holes have different lengths.

16. The semiconductor device of claim 10, wherein the dummy channel holes are patterned with a rectangle shape that is different from a circle shape of the channel holes, and the three of the dummy channel holes are arranged around the contact structure on the three sides in the hexagonal pattern with regard to the contact structure, the three sides separated from one another.

* * * * *